(12) United States Patent
Izumi

(10) Patent No.: US 6,646,266 B2
(45) Date of Patent: Nov. 11, 2003

(54) FLAT PANEL IMAGE SENSOR

(75) Inventor: Yoshihiro Izumi, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 123 days.

(21) Appl. No.: 10/022,387

(22) Filed: Dec. 20, 2001

(65) Prior Publication Data

US 2002/0092991 A1 Jul. 18, 2002

(30) Foreign Application Priority Data

Jan. 18, 2001 (JP) ........................................ 2001-010867
Oct. 2, 2001 (JP) ........................................ 2001-306959

(51) Int. Cl.⁷ ............................................. H01L 31/02
(52) U.S. Cl. ............................. 250/370.08; 250/370.09
(58) Field of Search ............................. 250/208.1, 332, 250/338.4, 370.08, 370.09; 348/162

(56) References Cited

U.S. PATENT DOCUMENTS 5,962,856 A * 10/1999 Zhao et al. ............. 250/370.09
6,172,369 B1 * 1/2001 Waechter et al. ...... 250/370.09
6,310,351 B1 * 10/2001 Zur ........................ 350/370.09
6,480,577 B1 * 11/2002 Izumi et al. ................. 257/546
6,559,451 B1 * 5/2003 Izumi et al. ............ 250/370.08

OTHER PUBLICATIONS

U.S. patent application Ser. No. 09/657,528, Izumi et al., filed Sep. 2000.
"Apllication of a–Si Active–Matrix Technology in a X–Ray Detector Panel" (L.S. Jeromin, et al., SID '97 Digest pp. 91–94, May 13, 1997).
"Similarities between TFT Arrays for Direct–Conversion X–ray Sensors and High–Aperture AMLCDS" (W.den Boer, et al., SID'98 Digest pp. 371–374, May 17, 1998).

* cited by examiner

Primary Examiner—G. Bradley Bennett
(74) Attorney, Agent, or Firm—Nixon & Vanderhye, P.C.

(57) ABSTRACT

In the present invention, the thickness of an insulating resin 6, in an area Y1 of an active matrix substrate 2 on which a semiconductor film 3 is formed, is equal to the thickness in an area X1 of the active matrix substrate 2 on which the semiconductor film 3 is not formed. On this account, in a flat panel image sensor 1, stress generated inside the insulating resin 6 is reduced, warpage of the active matrix substrate 2 is prevented in advance, and impact resistance of the flat panel image sensor 1 is improved.

16 Claims, 7 Drawing Sheets

FLAT PANEL IMAGE SENSOR

FIELD OF THE INVENTION

The present invention relates to a flat panel image sensor being capable of detecting an image of X-rays and other kind of radiation and visible, infrared, and other kind of light.

BACKGROUND OF THE INVENTION

Conventionally known flat panel image sensors are arranged so that while a semiconductor film, detecting X-rays and generating electric charges imparted by electron-hole pairs, is provided on an active matrix substrate, electric switches are provided in pixels arranged on the active matrix substrate in a matrix manner, and the electric switches are sequentially turned on in pixels of each column to read electric charges of pixels in each row.

For instance, the structure and principles thereof are explained in publications including L. S. Jeromin, et al., "Application of a-Si Active-Matrix Technology in a X-Ray Detector Panel" (SID 97 Digest, pp. 91–94, disclosed on May 13, 1997) and W. den Boer, et al., "Similarities between TFT Arrays for Direct-Conversion X-Ray Sensors and High-Aperture AMLCDS" (SID 98 Digest, pp. 371–374, disclosed on May 17, 1998).

Now, an arrangement of the conventional flat panel image sensor will be discussed.

FIG. 12 shows that a conventional flat panel image sensor 100 includes:
- an active matrix substrate 200 which is substantially square and on which pixels 210 are arranged in a matrix manner;
- a substantially square semiconductor film 300, sharing the center with the active matrix substrate 200, formed on the active matrix substrate 200; and a bias electrode 400 formed on the substantially entire surface of the semiconductor film 300.

Each pixel 210 on the active matrix substrate 200 includes, as an enlarged view of FIG. 13 shows, electrode wires arranged in an XY matrix including a scanning wire 211 and a signal wire 212, a thin film transistor (hereinafter, will be simply referred to as TFT) 213, and a charge storage (hereinafter, will be simply referred to as CS) 214 formed with respect to the active matrix substrate 200 (see FIG. 12).

The semiconductor film 300 (see FIG. 12) is made of a photoconductive substance that generates electric charges when X-rays and other kind of radiation are projected thereon. Photoconductivity means a characteristic that electric charges are generated when X-rays etc. are projected.

For instance, in the documents cited above, what is employed for use as the semiconductor film is amorphous selenium (hereinafter, will be simply referred to as a-Se) that has high dark resistance, exhibits satisfactory photoconductivity when exposed to X-rays, and is easy to form large films by vapor deposition.

Meanwhile, an active matrix substrate formed in a process to manufacture a liquid crystal display unit can be appropriated for use as the active matrix substrate 200. For instance, since each pixel of the active matrix substrate used for an active matrix liquid crystal display (hereinafter, will be simply referred to as AMLCD) includes a TFT made of amorphous silicon (hereinafter, will be simply referred to as a-Si) or polysilicon (hereinafter, will be simply referred to as p-Si), XY matrix electrodes, and a CS, the active matrix substrate is easily modified as the active matrix substrate for the flat panel image sensor.

Next, a function of a conventional flat panel image sensor will be described. When X-rays and other kind of radiation are projected onto the semiconductor film 300 such as an a-Se film, electric charges are generated in the semiconductor film 300. The charges generated in the semiconductor film 300 move toward the anodes and cathodes, if voltage is applied to the bias electrode 400. Consequently, the electric charges are accumulated in the CS 214 formed on the active matrix substrate 200.

The electric charges thus accumulated in the CS 214 can be taken out to the outside through the signal wire 212, by making the TFT 213 into an on-state by means of an input signal from the scanning wire 211.

As FIG. 13 indicates, the electrode wire including the scanning wire 211 and the signal wire 212, the TFT 213, the CS 214 etc. are all provided on the active matrix substrate 200 (see FIG. 12) in an XY matrix manner. Thus electric charges as information of images accumulated in each CS 214 are taken out to the outside through the associated signal wire 212 by making the associated TFT 213 into an on-state by sequentially scanning an input signal with respect to the associated scanning wire 211, so that information on a two-dimensional image of X-rays is obtainable.

Moreover, if the semiconductor film 300 of the conventional flat panel image sensor 100 exhibits photoconductivity to visible or infrared light, as well as radiation such as X-rays, the flat panel image sensor 100 can function as a two-dimensional visible or infrared image detector. For instance, since the a-Se film mentioned above exhibits a satisfactory level of photoconductivity to visible light, the film can be used as a high sensitive image sensor by utilizing avalanche effect on the application of a strong electric field.

However, the conventional flat panel image sensor 100 could discharge around the sensor due to a requirement of charging high voltage to the bias electrode 400. Moreover, the semiconductor film 300 is susceptible to pollution.

To resolve these problems, as FIG. 14 shows, a conventional flat panel image sensor 110 includes:
- a spacer 500 which is shaped like a substantially square frame and provided on an edge of an active matrix substrate 200;
- an insulating resin 600 formed to cover both areas on the active matrix substrate 200, one which is indicated as Y10 on which the semiconductor chip 300 is formed, and the other which is indicated as X10 on which the semiconductor chip 300 is not formed; and
- a protective substrate 700 provided to be in parallel with the active matrix substrate 200 while keeping a certain distance from the substrate 200 by the spacer 500.

Incidentally, the insulating resin 600 is sealed by the spacer 500, and the protective substrate 700 and the active matrix substrate 200 are a substantially identical square.

The protective substrate 700 provided above the insulating resin 600 is situated for:
- improving the strength of the flat panel image sensor 110;
- mechanically protecting an exposed surface of the insulating resin 600; and
- segregating the insulating resin 600 from outside moisture, etc.

However, in the conventional flat panel image sensor 110, the semiconductor film 300 is arranged to have the thickness around from several hundred microns to 1 mm, to improve absorption efficiency of X-rays. Therefore, in the part Y10 where the semiconductor film 300 is formed on the active matrix substrate 200, the thickness of the insulating resin 600 formed on the active matrix substrate 200 differs from the thickness in the part X10 where the semiconductor film 300 is not formed.

In other words, a thickness x10 of the insulating resin 600 in the area X10 is greater than a thickness y10 of the insulating resin 600 in the area Y10, because the thickness equivalent to that of the semiconductor film 300 is added to the former.

Furthermore, the volume of resin materials such as a photo-setting resin, a thermosetting resin, and a two-liquid-setting resin shrinks around 5 to 10% when hardened.

For instance, assuming that the thickness of the semiconductor film 300 is 1 mm, the difference between the thicknesses x10 and y10 of the insulating resin 600 is 1 mm, and hence the difference in the reduction in thickness of the insulating resin 600 due to the hardening differs by around 50 to 100 $\mu$m.

In this manner, the area Y10 on the active matrix substrate 200 where the semiconductor film 300 is formed differs from the surrounding area X10 where the semiconductor film 300 is not formed, in the amount of the reduced thickness of the insulating resin 600 due to the hardening. Thus great internal stress is accumulated around the border of the areas Y10 and X10.

As a result, the conventional flat panel image sensor 110 is not reliable in terms of the strength for various reasons: namely the accumulated stress causes the edge of the active matrix substrate 200 being warped and impact strength of the flat panel image sensor 110 being degraded, etc.

SUMMERY OF THE INVENTION

The present invention has an object to provide a highly reliable flat panel image sensor in terms of the strength, to resolve the problems described above.

To achieve the object, a flat panel image sensor of the present invention includes:

an active matrix substrate;
a semiconductor film formed on the active matrix substrate;
a bias electrode formed on the semiconductor film;
a first spacer formed on the active matrix substrate so as to surround the semiconductor film;
an insulating resin formed on surfaces of the semiconductor film, the bias electrode, and the active matrix substrate, and sealed by the first spacer; and
a protective substrate facing the active matrix substrate via the first spacer and covering the insulating film, wherein the insulating resin formed on the semiconductor film is as thick as the insulating resin formed on a peripheral part of the active matrix substrate, in which part neither the semiconductor film nor the first spacer is formed.

In this invention, the insulating resin formed on the semiconductor film is as thick as the insulating resin formed on a peripheral part of the active matrix substrate, in which part neither the semiconductor film nor the first spacer is formed. In other words, the thickness of the insulating resin in the both sides of the border, i.e. in the part on the active matrix substrate, in which part the semiconductor film is formed, and in the part of the active matrix substrate, in which part the semiconductor film is not formed, is uniform.

The inventor compared the flat panel image sensor of the present invention arranged as above with a conventionally structured flat panel image sensor, by examining an internal stress in the insulating resin around the border between a part of the active matrix substrate in which part the semiconductor film is formed and in a part of the active matrix substrate in which part the semiconductor film is not formed.

Incidentally, the examined conventionally structured flat panel image sensor shares a common arrangement with the flat panel image sensor of the present invention, except that the thickness of an insulating resin formed on semiconductor film is different from the thickness of an insulating resin formed on a surrounding part of the active matrix substrate, in which part the semiconductor film and a first spacer are not formed. That is, the difference of the thickness of the insulating resin around the border of these two parts is observed in the latter.

Tremendous effort has proven that the internal stress generated around the aforementioned border in the flat panel image sensor of the present embodiment, in which no difference of the thickness of the insulating resin was observed around the border, is smaller than the internal stress around the border in the conventionally structured flat panel image sensor, in which the difference was observed.

Therefore the stress in the insulating resin can be reduced and hence the warpage of the active matrix substrate is prevented in advance, and the impact strength of the flat panel image sensor is improved.

As a result, it is possible to provide the flat panel image sensor having excellent strength.

For a fuller understanding of the nature and advantages of the invention, reference should be made to the ensuing detailed description taken in conjunction with the accompanying drawings.

DESCRIPTION OF THE EMBODIMENTS

[Embodiment 1]

Figure 1:
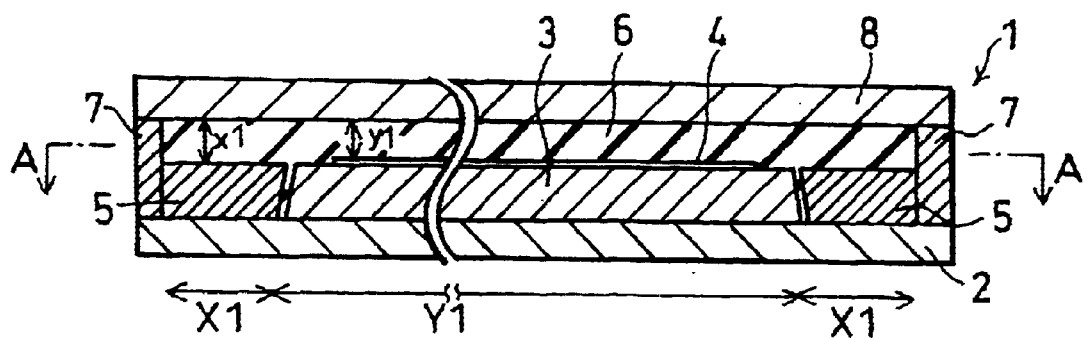
FIG. 1 is a cross-sectional view schematically showing an arrangement of a flat panel image sensor in accordance with the present invention.
Figure 2:
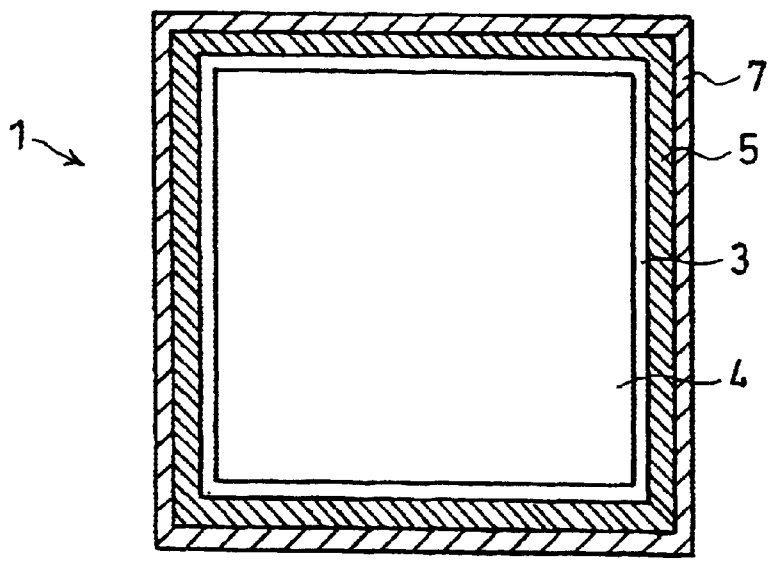
FIG. 2 is a cross-sectional view taken on line A—A of the flat panel image sensor shown in FIG. 1.

The following description will discuss an embodiment in accordance with the present invention in reference to FIGS. 1 and 2.

A flat panel image sensor 1 of the present embodiment includes an active matrix substrate 2, a semiconductor film 3, and a bias electrode 4, as FIG. 1 shows.

The active matrix substrate 2 is substantially rectangular or square, and on the surface thereof unillustrated pixels are arranged in an XY matrix manner. Also, an active matrix substrate formed in a process to manufacture a liquid crystal display shares a common arrangement with the active matrix substrate 2, and hence the former can be appropriated for use as the latter. Examples include active matrix substrates such as a glass substrate including TFTs made of a-Si, p-Si, etc., electrodes arranged in an XY matrix manner, and CSs.

Moreover, the size of the active matrix substrate 2 is determined by a size of a receiving area of the flat panel image sensor 1. A receiving area of around 23 cm (approximately 9 inch)×23 cm to 43 cm (approximately 17 inch)×43 cm is required, assuming that the flat panel image sensor is for receiving medical X-rays. Thus the width of an area, where the semiconductor film 3 is formed on the active matrix substrate 2 and indicated as an area Y1 in FIG. 1, should be around 23 cm to 43 cm (hereinafter, the area where the semiconductor film 3 is formed on the active matrix substrate 2 will be simply referred to as Y1).

The semiconductor film 3 formed on the active matrix substrate 2 is a substantially rectangular or square which is smaller than the active matrix substrate 2, and substantially shares the center with the active matrix substrate 2. The semiconductor film 3 is made of photoconductive materials such as a-Se, a-Si, cadmium telluride (CdTe), cadmium zinc telluride (CdZnTe), lead iodide($PbI_2$), mercury iodide ($HgI_2$), etc.

The width of an area on the active matrix substrate 2, indicated as an area Xi in FIG. 1, in which area the semiconductor film 3 is not formed, is generally around 1 cm to 3 cm (hereinafter, the area where the semiconductor film 3 is not formed on the active matrix substrate 2 will be simply referred to as X1).

The present embodiment chooses a-Se, which has small dark current and can be formed as a film on the large active matrix substrate 2 at a low temperature, as a material of the semiconductor film 3. Taking absorption efficiency of X-rays into account, the thickness of the film is preferably 0.5 mm to 1.5 mm assuming that a-Se is used as the semiconductor film 3, and hence in the present embodiment the thickness of the semiconductor film 3 is established at 1 mm.

The bias electrode 4 is formed on the substantially entire surface of the semiconductor film 3. A thin film made of various metals can be used as the bias electrode 4. The thickness of the bias electrode 4 is preferably not more than 1 $\mu$m.

Furthermore, the flat panel image sensor 1 includes, as FIG. 2 shows, an inner spacer 5 which is a second spacer provided to surround the semiconductor film 3. The inner spacer 5 is shaped like a rectangular or square frame in which the semiconductor film 3 is inserted. Moreover, as FIG. 1 indicates, the inner spacer 5 wholly covers the area X1 and is as thick as the semiconductor film 3.

Incidentally, when a mounting position of the semiconductor film 3 on the active matrix substrate 2 and a taper shape at the edge of the semiconductor 3 are not accurate enough, to regulate these inaccuracies, the gap between the inner spacer 5 and the semiconductor film 3 is slightly widened so that the area where the semiconductor film 3 is not formed and the area where the inner spacer 5 is formed, both on the active matrix substrate 2, are substantially matched with each other. In this case, the gap between the inner spacer 5 and the semiconductor film 3 is preferably not more than 5 mm.

For the sake of convenience, the description ignores the thickness of the bias electrode 4 and hence the inner spacer 5 is regarded as thick as the semiconductor film 3, since the thickness of the bias electrode 4 is not more than 1/1000 of that of the semiconductor film 3. However, when the bias electrode 4 is relatively thick with respect to the semiconductor film 3 and an adverse effect of the thickness of the bias electrode 4 cannot be overlooked, the thickness of the inner spacer 5 is adjusted to be substantially as thick as the semiconductor film 3 by arranging the sum of the thickness of the semiconductor film 3 and that of the bias electrode 4 being as large as the thickness of the inner spacer 5.

As a result, the upper surface of the semiconductor film 3 is flush with that of the inner spacer 5.

What can be used as the inner spacer 5 are such as ceramics, glass, and resins having high insulating performance. The resins are, for instance, fluororesins such as Teflon (registered trademark), epoxy resins, silicon resins, and acrylonitrile-butadiene-styrene (ABS) resins.

The flat panel image sensor 1 includes, as FIG. 1 shows, the semiconductor film 3 whose surface is covered with the bias electrode 4 and an insulating resin 6 covering the whole top face of the inner spacer 5.

Furthermore, the deposited insulating resin 6 and the inner spacer 5, thus deposited, are surrounded by an outer spacer 7 as a first spacer. The outer spacer 7, slightly thicker than the inner spacer 5, is formed on the active matrix substrate 2, sealing the insulating resin 6.

Also, as FIG. 2 shows, the outer spacer 7 is substantially shaped like a rectangular or square frame, and surrounds the semiconductor film 3 without touching the same. In other words, the inner spacer 5 is inserted in the gap between the semiconductor film 3 and the outer spacer 7.

The flat panel image sensor 1 further includes, as FIG. 1 shows, a protective substrate 8 facing the active matrix substrate 2 via the outer spacer 7. The protective substrate 8 is formed to cover the insulating resin 6. The protective substrate 8 is substantially rectangular or square and has substantially the same area with the active matrix substrate 2, and the gap between these two is kept at a certain distance by the outer spacer 7.

In short, the insulating resin 6 fills the gap between the protective substrate 8 and the active matrix substrate 2 having the surface on which the semiconductor film 3 and the inner spacer 5 are formed.

As the insulating resin 6, a setting resin that is liquid before the filling and hardened after the filling is used to completely fill the gap between the protective substrate 8 and the active matrix substrate 2 having the surface on which the semiconductor film 3 is formed. Examples of that setting resins are an acryl photo-setting resin and an epoxy two-liquid-setting resin. The insulating resin 6 is preferably around 0.5 to 3 mm thick. As for the protective substrate 8, a glass substrate, ceramic substrates, a resin substrate etc. can be used.

In the meantime, ceramics, glass, and resins having high insulating performance can be used as a material of the outer spacer 7. The resins are, for instance, fluororesins such as Teflon (registered trademark), epoxy resins, silicon resins, and ABS resins.

If there are gaps between the outer spacer 7 and the active matrix substrate 2 and between the outer spacer 7 and the protective substrate 8, the gaps may be sealed with resins such as silicon resin and epoxy resin on an as-needed basis.

Incidentally, the flat panel image sensor 1 of the present embodiment may be arranged so that the inner spacer 5 may be molded so as to be integrated with the outer spacer 7. This makes it possible to simplify the manufacturing process of the flat panel image sensor 1.

A part of the protective substrate 8 is penetrated or a corner thereof is cut off to expose the bias electrode 4, and a lead for applying voltage to the bias electrode 4 is provided extending through the hole. The lead may be provided extending through from a hole penetrated through the outer spacer 7 in advance.

In the arrangement above, a thickness y1 of the insulating resin 6 in the area Y1, shown in FIG. 1, is as thick as a thickness x1 of the insulating resin 6 in the area X1 shown in FIG. 1., i.e. an area in which the inner space 5 is formed in its entirety.

Next, an example of a manufacturing method of the flat panel image sensor 1 in accordance with the embodiment above will be described.

First, the active matrix substrate 2 is formed by arranging pixels on the surface thereof in an XY matrix manner (step 1: hereinafter, "step" will be simply referred to as "S"). Then the semiconductor film 3 is formed on the active matrix substrate 2, and the bias electrode 4 is formed on the substantially entire surface of the semiconductor film 3 (S2).

Then the inner spacer 5 is provided to surround the semiconductor film 3, and fixed on the active matrix substrate 2 by an adhesive (S3). Incidentally, if a resin material is used for the inner spacer 5, the inner spacer 5 may be provided by hardening the resin after the resin material is applied to the active matrix substrate 2 directly. Then the outer spacer 7 is further provided to surround the inner spacer 5, and then fixed on the active matrix substrate 2 by using an adhesive (S4). As described above, the inner spacer 5 and the outer spacer 7 are made of a resin material having high insulating performance, and is hardened to be a specified shape before fixed on the active matrix substrate 2. If there is a gap left between the outer spacer 7 and the active matrix substrate 2, it is possible to seal the gap by a resin such as a silicon resin or an epoxy resin.

Then the insulating resin 6 is injected to cover the semiconductor film 3, having the surface on which the bias electrode 4 is formed, and the inner spacer 5, so that the outer spacer 7 forms sealing (S5).

Then the protective substrate 8 is adhered and fixed to the outer spacer 7 to cover the surface of the insulating resin 6 and the surface of the outer spacer 7 (S6). If there is a possibility that formed bubbles are trapped in, the process can be done in a partially or completely evacuated condition. If there is a gap between the outer spacer 7 and the protective substrate 8, the gap may be sealed by a resin such as a silicon resin or an epoxy resin on an as-needed basis.

It is possible to do S6 before S5, that is to say, it is possible to fill the insulating resin 6 after the protective substrate 8 is adhered and fixed to the outer spacer 7.

In this case, an injection hole (not illustrated) for injecting the insulating resin 6 and a deairing hole (not illustrated) are provided through the outer spacer 7 or the protective substrate 8. On this account, the insulating resin 6 is injected through the injection hole, at the same time bubbles formed by the injection are discharged through the deairing hole. By the way, the injection hole and deairing hole are sealed with an adhesive etc. after the injection of the insulating resin 6.

It is also possible to adhere and fix the outer spacer 7, on which the protective substrate 8 is adhered in advance, in S4 instead of S6, and then carry out S5. The protective substrate 8 may be molded so as to be integrated with the outer spacer 7.

Then the insulating resin 6 is hardened using methods such as thermosetting and photo-setting (S7).

The flat panel image sensor 1 in accordance with the present embodiment is manufactured through these steps from S1 to S7.

As described above, in the flat panel image sensor 1 of the present embodiment, the thickness of the insulating resin 6 in the area Y1 is identical with the thickness in the area X1.

So reduction of the internal stress in the insulating resin 6 around the border between the areas Y1 and X1 is confirmed as follows.

That is, in regard of the internal stress in the insulating resin 6 around the border between the areas X1 and Y1, a photoelastic effect in accordance with variation of the internal stress and the presence or absence of a microscopic void in the insulating resin 6 are monitored and compared with respect to the flat panel image sensor 1 of the present embodiment and a conventional flat panel image sensor.

Figure 14:
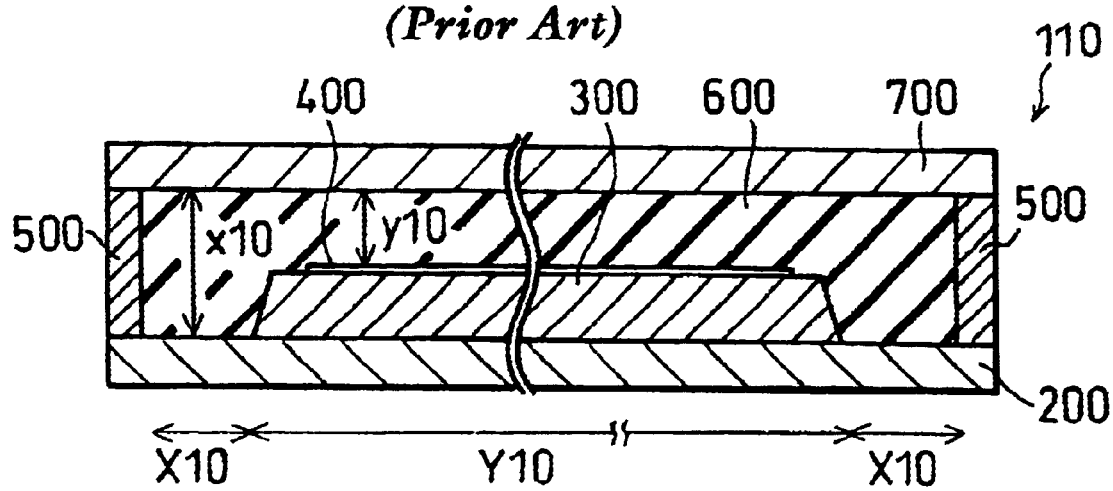
FIG. 14 is a cross-sectional view schematically showing an arrangement of a conventional flat panel image sensor.

The conventional flat panel image sensor used here is, as FIG. 14 shows, a flat panel image sensor 110 including:

a spacer 500 substantially shaped like a square frame provided around the rim of an active matrix substrate 200;

an insulating resin 600 covering both areas on the active matrix substrate 200, that is, covering the area on which the semiconductor chip 300 is formed and the surrounding area on which the semiconductor chip 300 is not formed; and a protective substrate 700 provided in parallel with the active matrix substrate 200 while keeping a certain distance from the substrate 200 by the spacer 500.

The photoelastic effect means a variation of a refractive index caused by elastic deformation of a transparent material due to stress, and the void is a hollow formed inside an insulating resin by virtue of stress. It is possible to monitor generation of stress inside an insulating resin by examining the photoelastic effect and the presence or absence of the void.

As a result of the comparison, the refractive index of the insulating resin 6 was substantially isotropic and continuous and no void could be observed, around the border in the flat panel image sensor 1 of the present embodiment.

Meanwhile, the photoelastic effect on account of anisotropy of the refractive index and generation of the void were observed around the border in the conventionally structured flat panel image sensor 110.

This proves that while the internal stress in the insulating resin 600 around the border in the conventional flat panel image sensor 110 is great, the internal stress in the insulating resin 6 around the border in the flat panel image sensor 1 of the present embodiment is small.

Thus the flat panel image sensor 1 is capable of reducing the stress generated in the insulating resin 6 so that warpage of the active matrix substrate 2 can be prevented in advance and the flat panel image sensor 1 can have improved impact strength.

Therefore it is possible to provide the flat panel image sensor 1 having excellent impact strength.

The flat panel image sensor 1 of the present embodiment arranged as above may include:

the inner spacer 5 which covers the whole area X1 and has an identical thickness with that of the semiconductor film 3; and the insulating resin 6 formed on the inner spacer 5 as well as the semiconductor film 3.

According to the arrangement above, the inner spacer 5 is as thick as the semiconductor film 3. This makes it possible to easily cancel out the difference in the thickness of the insulating resin 6 in the conventional flat panel image sensor 110 observed around the border between the areas Y1 and X1, by providing the inner spacer 5 and forming the insulating resin 6 on the inner spacer 5 and the semiconductor film 3.

Therefore this makes it possible to easily acquire the flat panel image sensor 1 having excellent strength along with the advantages of the aforementioned arrangement.

The flat panel image sensor 1 of the present embodiment as arranged above may include:

the inner spacer 5 which covers the whole area X1 and has an identical thickness with the sum of the thicknesses of the semiconductor film 3 and the bias electrode 4; and the insulating resin 6 formed on the inner spacer 5 as well as the semiconductor film 3.

According to the arrangement above, the inner spacer 5 has the identical thickness with the sum of the thicknesses of the semiconductor film 3 and the bias electrode 4. That is, the difference in the thickness of the insulating resin 6, around the border between the areas Y1 and X1, can be completely eradicated by forming the insulating resin 6 on the inner spacer 5 and the semiconductor film 3.

Therefore this makes it possible to acquire the flat panel image sensor 1 having excellent strength along with the advantages of the aforementioned arrangement.

Incidentally, the description above is on an ideally arranged flat panel image sensor in which the thicknesses of the insulating resin 6 in both of the areas Y1 and X1 are equalized, by equalizing the thickness of the inner spacer 5 and that of the semiconductor film 3 (or the sum of the thickness of the semiconductor film 3 and that of the bias electrode 4). However, the present invention is not limited to this arrangement.

That is to say, the thickness of the inner spacer 5 can be arbitrarily established as long as the difference in the thicknesses of the insulating resin 6 in the areas X1 and Y1 is so small that the internal stress, causing the warpage of the active matrix substrate 2 and the degradation of the strength thereof, is not generated in the insulating resin 6. In other words, it is permitted that the thickness of the inner spacer 5 and that of the semiconductor film 3 (or the sum of the thickness of the semiconductor film 3 and that of the bias electrode 4) are not strictly identical.

An optimum thickness of the inner spacer 5 cannot be determined at a certain value, because it varies with the type of insulating resin 6, materials and sizes of the active matrix substrate 2 and the protective substrate 8 and other factors. However, as the optimum value, for instance, the thickness of the inner spacer 5 is preferably established within ±50% of the thickness of the semiconductor film 3.

Figure 3:
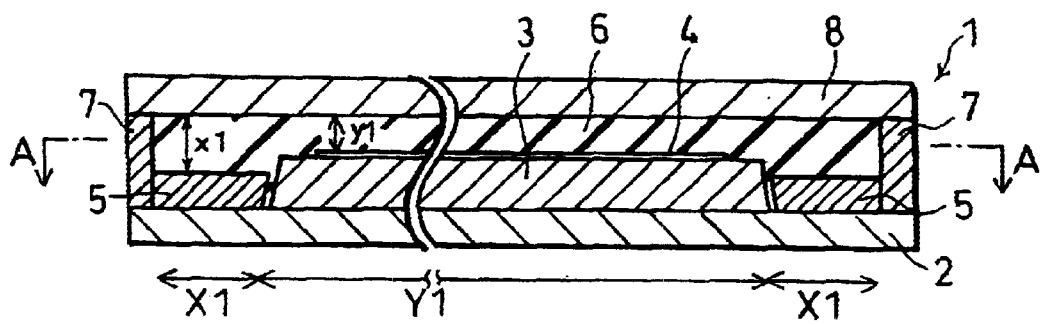
FIG. 3 is a cross-sectional view schematically showing another arrangement of a flat panel image sensor in accordance with the present invention.
Figure 4:
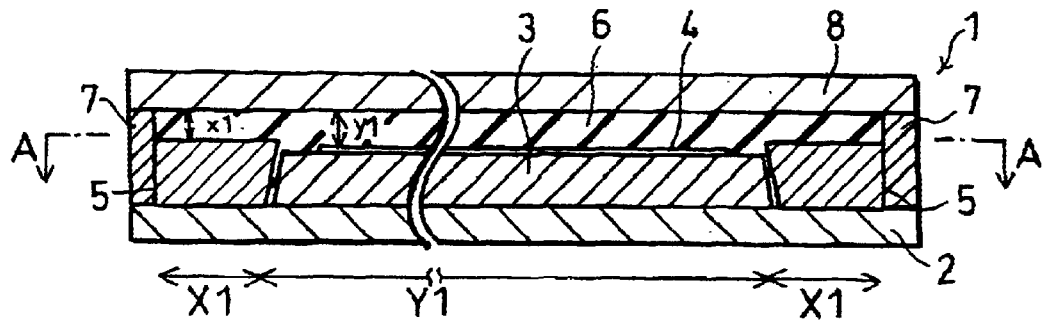
FIG. 4 is a cross-sectional view schematically showing another arrangement of a flat panel image sensor in accordance with the present invention.

For instance, as FIG. 3 shows, the thickness of the inner spacer 5 may be smaller than the sum of the thickness of the semiconductor film 3 and that of the bias electrode 4. Alternatively, as FIG. 4 shows, the thickness of the inner spacer 5 may be greater than the sum of the thickness of the semiconductor film 3 and the bias electrode 4.

As described above, the present embodiment may be arranged so that the inner spacer 5 for modifying the thickness of the insulating resin 6 is formed on the area X1 in which the outer spacer 7 is not formed.

According to the arrangement above, modifying the thickness of the inner spacer 5 reduces the difference in the thicknesses of the insulating resin 6 in the areas X1 and Y1 sufficiently to prevent generation of the stress in the insulating resin 6 causing the warpage of the active matrix substrate 2 and the degradation of the strength in the insulating resin 6.

Thus the stress in the insulating resin 6 can be reduced and hence the warpage of the active matrix substrate 2 is prevented in advance and the impact strength of the flat panel image sensor 1 is improved. As a result, it is possible to provide the flat panel image sensor 1 having excellent strength.

[Embodiment 2]

Figure 5:
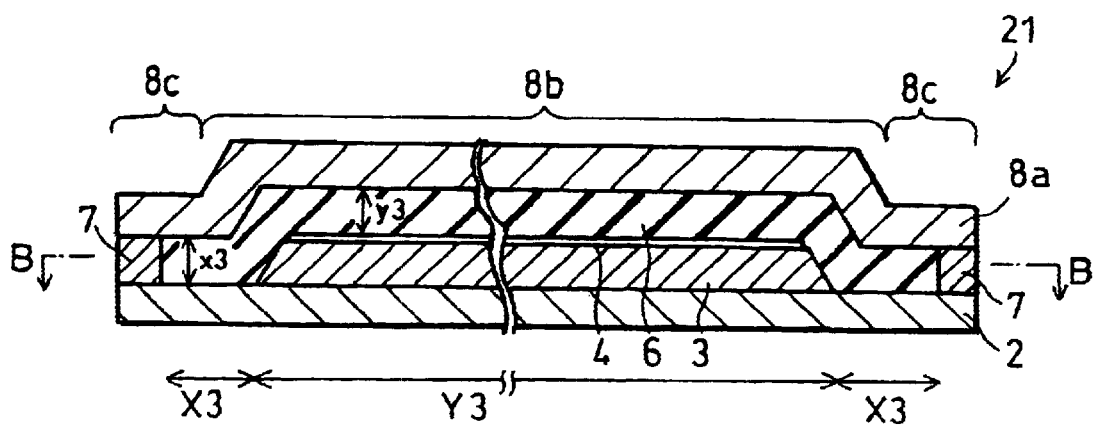
FIG. 5 is a cross-sectional view schematically showing another arrangement of a flat panel image sensor in accordance with the present invention.
Figure 6:
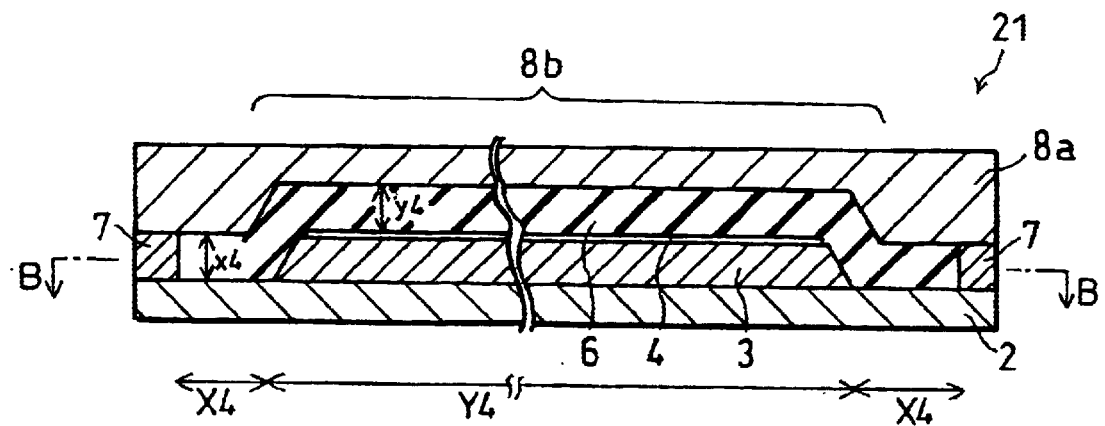
FIG. 6 is a cross-sectional view schematically showing another arrangement of a flat panel image sensor in accordance with the present invention.
Figure 7:
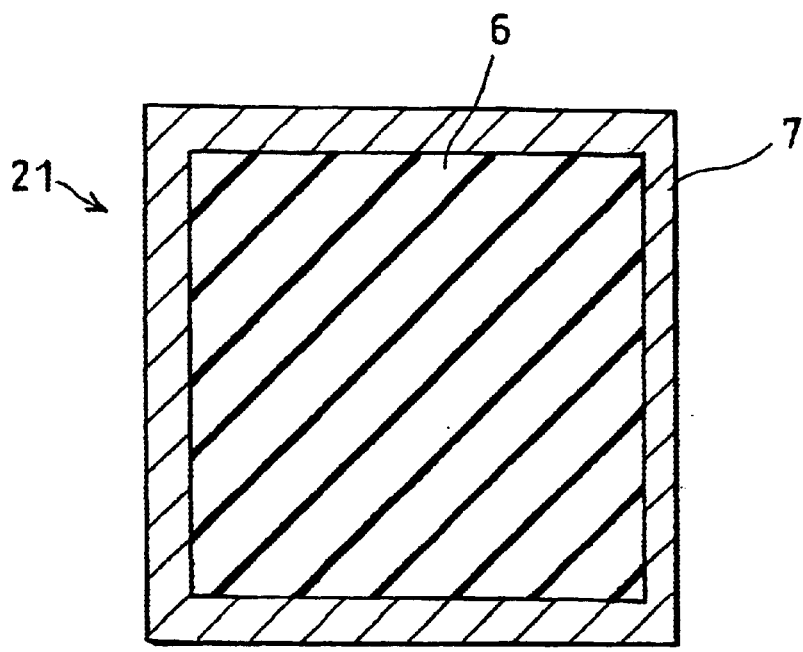
FIG. 7 is a cross-sectional view taken on line B—B of the flat panel image sensor shown in FIGS. 5 and 6.

The following description will discuss another embodiment in accordance with the present invention in reference to FIGS. 5 to 7.

A flat panel image sensor 21 of the present embodiment includes, as FIG. 5 shows, an active matrix substrate 2, a semiconductor film 3, a bias electrode 4, and an outer spacer 7. In this embodiment it is possible to use the active matrix 2, the semiconductor film 3, the bias electrode 4, and the outer spacer 7 used in Embodiment 1.

As FIG. 5 shows, the flat panel image sensor 21 of the present embodiment further includes a protective substrate 8a adhered and fixed on the upper face of the outer spacer 7. The periphery of the protective substrate 8a substantially draws a rectangle or square identical with the shape of the active matrix substrate 2.

Moreover, a pit part 8b is formed on a surface of the protective substrate 8a, which faces the active matrix substrate 2. The shape of the pit part 8b is matched with that of the semiconductor film 3. In other words, the depth of the pit part 8b is equal to the thickness of the semiconductor film 3. However, the pit part 8b may be shaped to have a depth equal to the sum of the thicknesses of the semiconductor film 3 and the bias electrode 4, when the bias electrode 4 is relatively thick with respect to the semiconductor film 3 and an adverse effect of the thickness of the bias electrode 4 cannot be overlooked.

The protective substrate 8a is formed, as FIG. 5 shows, to have a uniform thickness in all parts thereof, by forming a mound part 8c having a height matched with the depth of the pit part 8b. However, the shape of the protective substrate 8a is not limited to this so that it is allowed to make the top face of the protective substrate 8a horizontally flat, as FIG. 6 shows. Similarly with the protective substrate 8 of Embodiment 1, it is possible to use a glass substrate, ceramic substrates, a resin substrate, etc. as the protective substrate 8a.

Furthermore, the flat panel image sensor 21 includes an insulating resin 6, sealing the gap between the active matrix substrate 2 and the protective substrate 8a at the same time sealed by the outer spacer 7, as FIG. 7 shows. Materials used as the insulating resin 6 of the Embodiment 1 can be used as that of the present embodiment.

In the arrangement above, a thickness y3 of the insulating resin 6 in an area Y3 of the active matrix substrate 2, in which area the semiconductor film 3 is formed (shown in FIG. 5), is equal to a thickness x3 of the insulating resin 6 in an area X3 of the active matrix substrate 2, in which area the semiconductor film 3 is not formed (shown in FIG. 5). Similarly, a thickness y4 of the insulating resin 6 in an area Y4 of the active matrix substrate 2, in which area the semiconductor film 3 is formed (shown in FIG. 6), is equal to a thickness x4 of the insulating resin 6 in an area X4 of the active matrix substrate 2, in which area the semiconductor film 3 is not formed (shown in FIG. 6). (Hereinafter, the definitions of the thicknesses y3, y4, x3 and x4, and the areas Y3, Y4, X3, and X4 described above will be omitted.)

A part of the protective substrate 8a is penetrated or a corner thereof is cut off to expose the bias electrode 4, and a lead for applying voltage to the bias electrode 4 is provided extending through the hole.

If there is a gap left between the outer spacer 7 and the protective substrate 8a, it is possible to seal the gap by resins such as a silicon resin, on an as-needed basis.

Next, an example of a manufacturing method of the flat panel image sensor 21 in accordance with the embodiment above will be described.

First, the active matrix substrate 2 is formed by arranging pixels on the surface thereof in an XY matrix manner (S11). Then the semiconductor film 3 is formed on the active matrix substrate 2, and the bias electrode 4 is formed on the substantially entire surface of the semiconductor film 3 (S12). S11 is virtually identical with Si of the manufacturing method of the flat panel image sensor 1 of Embodiment 1, and S12 is virtually identical with S2 of the manufacturing method of the flat panel image sensor 1 of Embodiment 1.

Then the outer spacer 7 is provided to surround the semiconductor film 3, and fixed on the active matrix substrate 2 by an adhesive (S13). S13 is virtually identical with S4 of the manufacturing method of the flat panel image sensor 1 of Embodiment 1.

Then the insulating resin 6 is inserted to cover the semiconductor film 3 having the surface on which the bias electrode 4 is formed, so that the outer spacer 7 forms sealing (S14). S14 is virtually identical with S5 of the manufacturing method of the flat panel image sensor 1 of Embodiment 1.

Then the protective substrate 8a is provided to cover the insulating resin 6 and the outer spacer 7 (S15). S15 is virtually identical with S6 of the manufacturing method of the flat panel image sensor 1 of Embodiment 1.

S15 can be done before S14. That is to say, it is possible to insert the insulating resin 6 after the protective substrate 8a is adhered and fixed to the outer spacer 7. In this case, an injection hole (not illustrated) for injecting the insulating resin 6 and a deairing hole (not illustrated) are provided through the outer spacer 7 and the protective substrate 8a. On this account, the insulating resin 6 is injected through the injection hole, at the same time bubbles formed by the injection are discharged through the deairing hole. By the way, the injection hole and deairing hole are sealed with an adhesive etc. after the injection of the insulating resin 6.

Then the insulating resin 6 is hardened using methods such as thermosetting and photo-setting (S16) S16 is virtually identical with S7 of the manufacturing method of the flat panel image sensor 1 of Embodiment 1.

The flat panel image sensor 21 in accordance with the present embodiment is manufactured through these steps from S11 to S16.

As described above, in the flat panel image sensor 21 of the present embodiment, the thickness of the insulating resin 6 in the area Y3 is identical with the thickness in the area X3.

Thus the flat panel image sensor 21 is capable of reducing the stress generated in the insulating resin 6 so that warpage of the active matrix substrate 2 can be prevented in advance and the flat panel image sensor 21 can have improved impact strength.

Therefore it is possible to provide the flat panel image sensor 21 having excellent strength.

Also, the flat panel image sensor 21 of the present embodiment arranged as above includes the pit part 8b, having a depth equal to the thickness of the semiconductor film 3, and being formed on the whole part of the protective substrate 8a, in which part the protective substrate 8a faces the semiconductor film 3.

According to the arrangement above, the pit part 8b having a depth equal to the thickness of the semiconductor film 3 is formed in the protective substrate 8a. That is, providing the protective substrate 8a including the pit part 8b makes it possible to equalize the thicknesses y3 and x3.

Thus the difference in the thickness of the insulating resin 6 around the border between the areas Y3 and X3 can easily be cancelled out.

As a result, this makes it possible to easily acquire the flat panel image sensor 21 having excellent strength along with the advantages of the aforementioned arrangement.

As described above, the flat panel image sensor 21 of the present embodiment is arranged so that the pit part 8b, having a depth identical with the sum of the thicknesses of the semiconductor film 3 and the bias electrode 4, is formed to cover the entire surface of the protective substrate 8a, which faces the semiconductor film 3.

According to the arrangement above, the pit part 8b has a depth identical with the sum of the thicknesses of the semiconductor film 3 and the bias electrode 4 so that the difference in the thickness of the insulating resin 6 around the border between the areas Y3 and X3 can completely be cancelled out.

Thus this further makes it possible to easily acquire the flat panel image sensor 21 having excellent strength along with the advantages of the aforementioned arrangement.

Incidentally, as long as the thicknesses y3 and x3 of the insulating resin 6 are equal, for instance, it is possible to arrange the flat panel image sensor 21 to include an inner spacer 5 as in Embodiment 1 along with the pit part 8b of the protective substrate 8a, wherein the inner spacer 5 is lower than the semiconductor film 3 by an amount of A, while the depth of the pit part 8b with respect to the semiconductor film 3 is set as A.

Also, the inner spacer 5 may be formed higher than the semiconductor film 3 in the flat panel image sensor 21 by an amount of B, and the sensor 21 may further be arranged so that an area of the protective substrate 8a facing the semiconductor film 3 is set as a mound area whereas other areas except the mound area, in this case areas facing the inner spacer 5, are set as a pit area, so that the difference between the depths of the mound area and the pit area is set as B.

Furthermore, the flat panel image sensor 21 shown in FIG. 6 may be arranged so that the inner spacer 5 is provided on a certain area between the semiconductor film 3 and the outer spacer 7, and the protective substrate 8a is dented as much as the height of the inner spacer 5, compared to the arrangement shown in FIG. 6.

Incidentally, the description above is on the arrangement that the pit part 8b, having the depth equal to that of the semiconductor film 3 (the sum of the thicknesses of the semiconductor film 3 and the bias electrode 4), is formed in the protective substrate 8a so that the thickness of the insulating resin 6 in the area Y3 (Y4) is identical with the thickness in the area X3 (X4). However, the present invention is not limited to this arrangement.

An optimum depth of the pit part 8b cannot be determined at a certain value, because it varies with the type of insulating resin 6, materials and sizes of the active matrix substrate 2 and the protective substrate 8a and so forth. However, as an optimum value, for instance, the depth of the pit part 8b is preferably set within ±50% of the thickness of the semiconductor film 3.

That is to say, the depth of the pit part 8b can be arbitrarily set as long as the difference in the thicknesses of the insulating resin 6 in the areas X3 (X4) and Y3 (Y4) is so small that the internal stress, causing the warpage of the active matrix substrate 2 and the degradation of the strength thereof, is not generated. In other words, it is permitted that the depth of the pit part 8b and that of the semiconductor film 3 (or the sum of the thickness of the semiconductor film 3 and that of the bias electrode 4) are not strictly equal.

Figure 8:
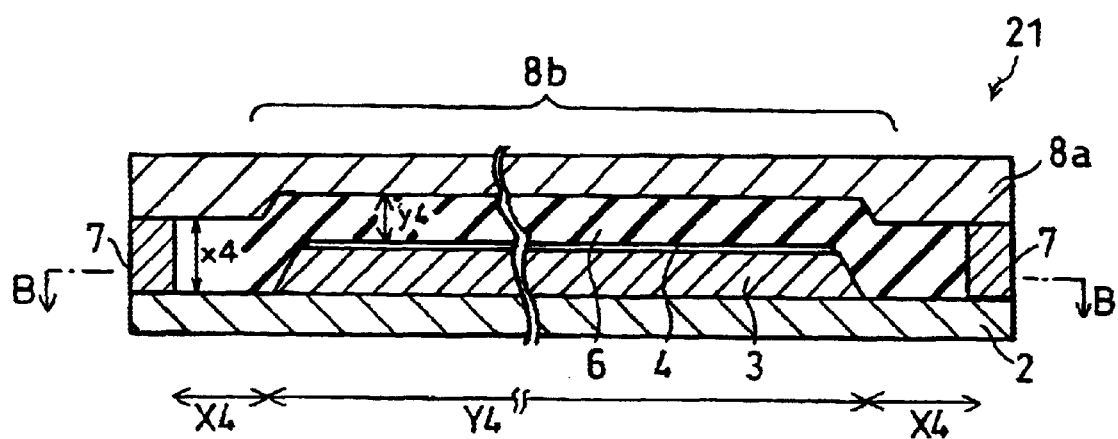
FIG. 8 is a cross-sectional view schematically showing another arrangement of a flat panel image sensor in accordance with the present invention.
Figure 9:
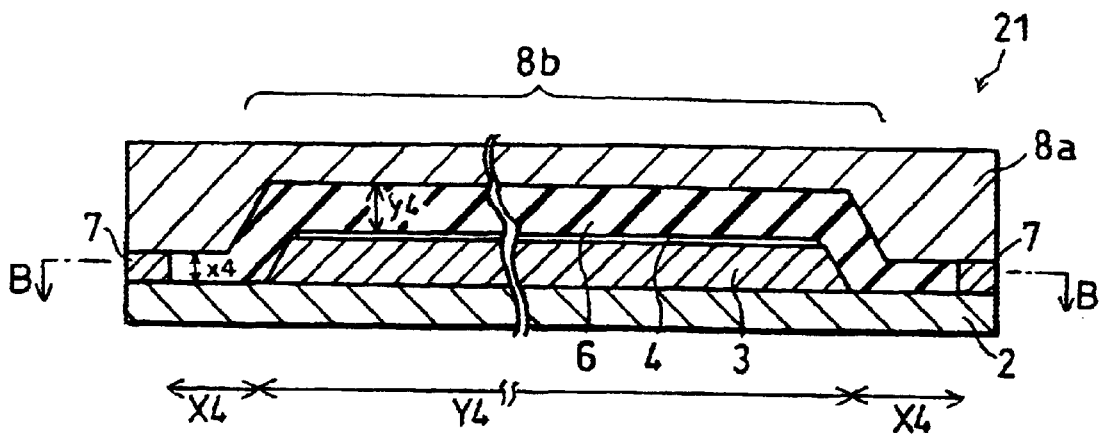
FIG. 9 is a cross-sectional view schematically showing another arrangement of a flat panel image sensor in accordance with the present invention.

For instance, as FIG. 8 shows, the depth of the pit part 8b may be smaller than the sum of the thickness of the semiconductor film 3 and that of the bias electrode 4. Also, as FIG. 9 shows, the depth of the pit part 8b may be greater than the sum of the thickness of the semiconductor film 3 and the bias electrode 4.

As described above, the present embodiment may be arranged so that the pit part 8b for modifying the thickness of the insulating resin 6 is formed on the whole area of the protective substrate 8a, which faces the semiconductor film 3.

According to the arrangement above, modifying the depth of the pit part 8b reduces the difference in the thicknesses of the insulating resin 6 in the areas X3 (X4) and Y3 (Y4) sufficiently to prevent generation of the stress in the insulating resin 6 causing the warpage and the degradation of the strength of the active matrix substrate 2.

Thus the stress in the insulating resin 6 can be reduced and hence the warpage of the active matrix substrate 2 is prevented in advance, and the impact strength of the flat panel image sensor 21 is improved. As a result, it is possible to provide the flat panel image sensor 21 having excellent strength.

[Embodiment 3]

Figure 10:
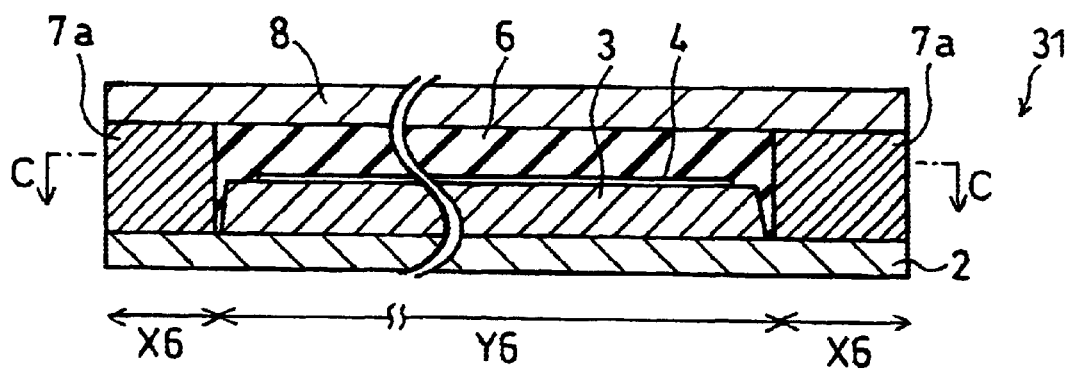
FIG. 10 is a cross-sectional view schematically showing another arrangement of a flat panel image sensor in accordance with the present invention.
Figure 11:
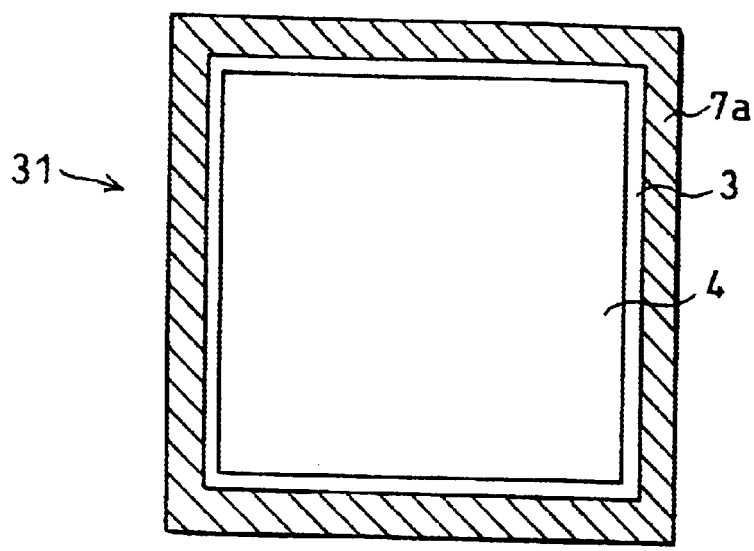
FIG. 11 is a cross-sectional view taken on line C—C of the flat panel image sensor shown in FIG. 10.
Figure 12:
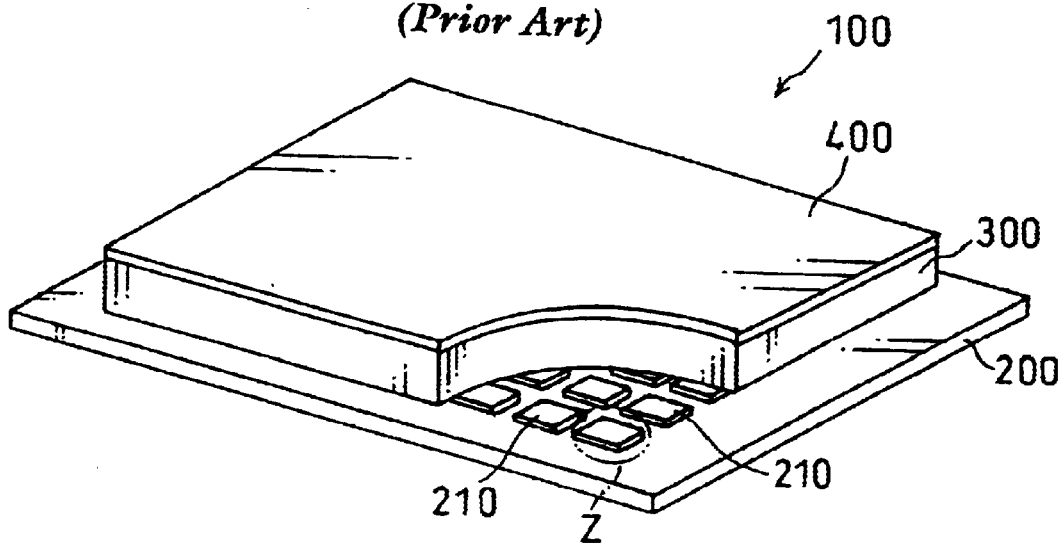
FIG. 12 is a perspective view showing an arrangement of a conventional flat panel image sensor.
Figure 13:
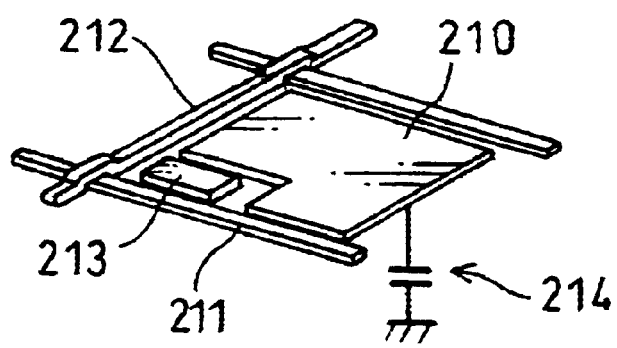
FIG. 13 is an enlarged perspective view showing a Z part of the flat panel image sensor in FIG. 12.

The following description will discuss another embodiment in accordance with the present invention in reference to FIGS. 10 and 11. By the way, members having the same functions as those described in Embodiments 1 and/or 2 with the figures are given the same numbers, so that the descriptions are omitted, for the sake of convenience.

A flat panel image sensor 31 of the present embodiment includes, as FIG. 10 shows, an active matrix substrate 2, a semiconductor film 3, and a bias electrode 4. In this embodiment it is possible to use the active matrix 2, the semiconductor film 3, and the bias electrode 4 used in Embodiment 1.

Moreover, the flat panel image sensor 31 of the present embodiment includes a spacer 7a formed to entirely cover an area X6 of the active matrix substrate 2, in which area the semiconductor film 3 is not formed. The spacer 7a is shaped like a rectangular or square frame (described later) surrounding the semiconductor film 3, and thicker than the semiconductor film 3.

Incidentally, when a mounting position of the semiconductor film 3 on the active matrix substrate 2 and a taper shape at the edge of the semiconductor 3 are not accurate enough, to regulate these inaccuracies, the gap between the spacer 7a and the semiconductor film 3 is slightly widened so that the area where the semiconductor film 3 is not formed and the area where the spacer 7a is formed are substantially matched with each other. In this case, the gap between the spacer 7a and the semiconductor film 3 is preferably not more than 5 mm.

As in Embodiment 1, the description ignores the thickness of the bias electrode 4 and hence the spacer 7 is regarded thicker than the semiconductor film 3, since the thickness of the bias electrode 4 is not more than 1/1000 of that of the semiconductor film 3. However, when the bias electrode 4 is relatively thick with respect to the semiconductor film 3 and an adverse effect of the thickness of the bias electrode 4 cannot be overlooked, the thickness of the spacer 7a is preferably adjusted to be thicker than the sum of the thickness of the semiconductor film 3 and that of the bias electrode 4.

As FIG. 11 shows, the spacer 7a is shaped like a rectangular or square frame in which the semiconductor film 3 is inserted.

Ceramics, glass, and resins having high insulating performance can be used as a material of the spacer 7a. The resins are, for instance, fluororesins such as Teflon (registered trademark), epoxy resins, silicon resin, and ABS resins.

The flat panel image sensor 31 includes, as FIG. 10 shows, a protective substrate 8 provided in parallel with the active matrix substrate 2 while keeping a certain distance from the substrate 2 by the spacer 7a. The protective substrate 8 used in Embodiment 1 can be used in this embodiment.

The flat panel image sensor 31 further includes an insulating resin 6 filling the gap between the active matrix substrate 2 and the protective substrate 8 at the same time sealed by the spacer 7a. As the insulating resin 6, a setting resin that is liquid before the filling and hardened after the filling is used to completely fill the gap between the protective substrate 8 and the active matrix substrate 2 having the surface on which the semiconductor film 3 is formed. The insulating resin 6 used in Embodiments 1 and/or 2 can be used in this embodiment.

As described above, the present embodiment is arranged so that an area X6, shown in FIG. 10, of the active matrix substrate 2, in which part the semiconductor film 3 is not formed, is scarcely filled with the insulating resin 6, while an area Y6, shown in FIG. 10, of the active matrix substrate 2, in which area the semiconductor film 3 is formed, is entirely filled with the insulating resin 6.

A part of the protective substrate 8 is penetrated or a corner thereof is cut off to expose the bias electrode 4, and a lead for applying voltage to the bias electrode 4 is provided extending through the hole.

If there are gaps between the spacer 7a and the active matrix substrate 2 and between the spacer 7a and the protective substrate 8, the gaps may be sealed with resins such as a silicon resin or a epoxy resin on an as-needed basis.

Next, an example of a manufacturing method of the flat panel image sensor 31 in accordance with the embodiment above will be described.

First, the active matrix substrate 2 is formed by arranging pixels on the surface thereof in an XY matrix manner (S21). Then the semiconductor film 3 is formed on the active matrix substrate 2, and the bias electrode 4 is formed on the substantially entire surface of the semiconductor film 3 (S22). S21 is virtually identical with S1 of the manufacturing method of the flat panel image sensor 1 of Embodiment 1, and S22 is virtually identical with S2 of the manufacturing method of the flat panel image sensor 1 of Embodiment 1.

Then the spacer 7a is provided to surround the semiconductor film 3, and fixed on the active matrix substrate 2 by an adhesive (S23). The spacer 7a is formed on an area X6 of the active matrix substrate 2, in which area the semiconductor film 3 is not formed. (Hereinafter, the descriptions of the area X6 described above will be omitted.) The spacer 7a is made of a resin material having high insulating performance, and is hardened to be a specified shape before fixed on the active matrix substrate 2. If there is a gap between the spacer 7a and the active matrix substrate 2, the gap is sealed with a resin such as a silicon resin or a epoxy resin. S23 is virtually identical with S4 of the manufacturing method of the flat panel image sensor 1 of Embodiment 1.

Then the insulating resin 6 is inserted to cover the semiconductor film 3 having the surface on which the bias electrode 4 is formed, so that the spacer 7a forms sealing (S24). S24 is virtually identical with S5 of the manufacturing method of the flat panel image sensor 1 of Embodiment 1.

Then the protective substrate 8 is provided to cover the insulating resin 6 and the spacer 7a (S25). If there is a possibility that formed bubbles are trapped in, the process can be done in a partially or completely evacuated condition. If there is a gap between the spacer 7a and the protective substrate 8, the gap may be sealed by a resin such as a silicon resin or an epoxy resin on an as-needed basis. S25 is virtually identical with S6 of the manufacturing method of the flat panel image sensor 1 of Embodiment 1.

S25 can be done before S24. That is to say, it is possible to insert the insulating resin 6 after the protective substrate 8 is adhered and fixed to the spacer 7a. In this case, an injection hole (not illustrated) for injecting the insulating resin 6 into the spacer 7a or the protective substrate 8 and a deairing hole (not illustrated) are provided. On this account, the insulating resin 6 is injected through the injection hole, at the same time bubbles formed by the injection are discharged through the deairing hole. By the way, the injection hole and deairing hole are sealed with an adhesive etc. after the injection of the insulating resin 6.

Then the insulating resin 6 is hardened using methods such as thermosetting and photo-setting (S26) S26 is virtually identical with S7 of the manufacturing method of the flat panel image sensor 1 of Embodiment 1.

The flat panel image sensor 31 in accordance with the present embodiment is manufactured through these steps from S21 to S26.

As described above, the flat panel image sensor 31 in accordance with the present embodiment includes the spacer 7a, formed on the area X6 and being thicker than the semiconductor film 3.

On this account, only a space above the semiconductor film 3, circumscribed by the spacer 7a and covered with the protective substrate 8 from above, is filled with the insulating resin 6, while there is no insulating resin 6 formed on the area X6.

Consequently, it is possible to form the insulating resin 6 only on the semiconductor film 3. Thus the stress conventionally generated in the border between the area X6 and an area Y6 in which the semiconductor film 3 is not formed, is not generated, since the thickness of the insulating resin 6 in the both sides of the border is uniform. (Hereinafter, the descriptions of the area Y6 described above will be omitted.)

Therefore this makes it possible to easily acquire the flat panel image sensor 31 having excellent strength.

The flat panel image sensor 31 of the present embodiment arranged as above may be arranged so that the spacer 7a is thicker than the sum of the thickness of the semiconductor film 3 and that of the bias electrode 4.

According to the arrangement above, only the space above the bias electrode 4, circumscribed by the spacer 7a and covered with the protective substrate 8 from above, is filled with the insulating resin 6, while there is no insulating resin 6 formed on the area X6.

Consequently, it is possible to form the insulating resin 6 only on the bias electrode 4. Thus the stress conventionally generated in the border between the area X6 and an area Y6 in which the semiconductor film 3 is not formed, is not generated, since the thickness of the insulating resin 6 in the both side of the border is uniform.

Therefore this makes it possible to easily acquire the flat panel image sensor 31 having excellent strength.

Incidentally, a flat panel image sensor of the present invention arranged as above may be arranged so that a first spacer is formed to surround a semiconductor film without touching the same.

According to this phase of the invention, the first spacer is formed to surround the semiconductor film without touching the same so that the first spacer can be easily provided around the semiconductor film.

Therefore this makes it possible to acquire the flat panel image sensor having excellent strength easily.

Moreover, the flat panel image sensor of the present invention arranged as above may be arranged so that a second spacer, which is as thick as the semiconductor film and formed on a whole part of the active matrix substrate, in which part neither the semiconductor film nor the first spacer is formed, is included, and also the insulating resin is formed on the second spacer and the semiconductor film.

According to this phase of the invention, the second spacer is as thick as the semiconductor film. That is, the difference in the thickness of the insulating resin around the border between a part of the active matrix substrate, in which part the semiconductor film is formed, and a part of the active matrix substrate, in which part the semiconductor film is not formed, can easily be cancelled out, by providing the second spacer in the conventionally structured flat panel image sensor and forming the insulating resin on the second spacer and the semiconductor film.

Therefore this makes it possible to easily acquire the flat panel image sensor having excellent strength along with the advantages of the aforementioned arrangement.

Moreover, the flat panel image sensor of the present invention arranged as above may include a second spacer, which is as thick as the semiconductor film and formed on a whole part of the active matrix substrate, in which part neither the semiconductor film nor the first spacer is formed, wherein the insulating resin is formed on the second spacer and the semiconductor film.

According to this phase of the invention, the second spacer is as thick as a sum of a thickness of the semiconductor film and that of the bias electrode. Thus by forming the insulating resin on the second spacer and the semiconductor film, the difference in the thickness of the insulating resin, around the border between a part of the active matrix substrate in which part the semiconductor film is formed, and a part of the active matrix substrate, in which part the semiconductor film is not formed, can completely be cancelled out.

Therefore this makes it possible to easily acquire the flat panel image sensor having excellent strength along with the advantages of the aforementioned arrangement.

Moreover, the flat panel image sensor of the present invention arranged as above may be arranged so that a pit part, whose depth is equal to a thickness of the semiconductor film, is formed on a whole part of the protective substrate, in which part the protective substrate faces the semiconductor film.

According to this phase of the invention, the pit part, whose depth is equal to the thickness of the semiconductor film, is formed on the protective substrate. Thus providing the protective substrate with the pit part makes the insulating resin formed on the semiconductor film be as thick as the insulating resin formed on a peripheral part of the active matrix substrate, in which part the semiconductor film is not formed.

Thus the difference in the thickness of the insulating resin, around the border between a part of the active matrix substrate, in which part the semiconductor film is formed, and a part of the active matrix substrate, in which part the semiconductor film is not formed, can easily be cancelled out.

Therefore this makes it possible to easily acquire the flat panel image sensor having excellent strength along with the advantages of the aforementioned arrangement.

Moreover, the flat panel image sensor of the present invention arranged as above may be arranged so that a pit part, whose depth is equal to a sum of a thickness of the semiconductor film and that of the bias electrode, is formed on a whole part of the protective substrate, in which part the protective substrate faces the semiconductor film.

According to this phase of the invention, the pit part has the depth equal to the sum of the thickness of the semiconductor film and that of the bias electrode. Thus the difference in the thickness of the insulating resin around the border, between a part of the active matrix substrate in which part the semiconductor film is formed, and a part of the active matrix substrate, in which part the semiconductor film is not formed, can completely be cancelled out.

Therefore this makes it possible to easily acquire the flat panel image sensor having excellent strength along with the advantages of the aforementioned arrangement.

Moreover, the flat panel image sensor of the present invention arranged as above may include:
- an active matrix substrate;
- a semiconductor film formed on the active matrix substrate;
- a bias electrode formed on the semiconductor film;
- a spacer formed on the active matrix substrate so as to surround the semiconductor film;
- an insulating resin formed on the semiconductor film and sealed by the spacer; and
- a protective substrate facing the active matrix substrate via the spacer and covering the insulating film, wherein the spacer is formed to cover a whole part of the active matrix substrate, in which part the semiconductor film is not formed, and also is formed to be thicker than the semiconductor film.

According to this phase of the invention, the spacer is formed to cover a whole part of the active matrix substrate, in which part the semiconductor film is not formed, and also is formed to be thicker than the semiconductor film.

On this account, only a space above the semiconductor film, circumscribed by the spacer and covered with the protective substrate from above, is filled with the insulating resin, while there is no insulating resin formed on the part of the active matrix substrate, in which part the semiconductor film is not formed.

Consequently it is possible to form the insulating resin only on the semiconductor film, and hence the internal stress conventionally generated in the border between a part of the active matrix substrate, in which part the semiconductor film is formed, and a part of the active matrix substrate, in which part the semiconductor film is not formed, is not generated, since the thickness of the insulating resin in the both side of the border is uniform.

Therefore this makes it possible to acquire the flat panel image sensor having excellent strength.

Moreover, the flat panel image sensor of the present invention arranged as above may be arranged so that the spacer is formed to be thicker than a sum of a thickness of the semiconductor film and that of the bias electrode.

According to this phase of the invention, only the space above the bias electrode, circumscribed by the spacer and covered with the protective substrate from above, is filled with the insulating resin, while there is no insulating resin formed on a part of the active matrix substrate, in which part the semiconductor film is not formed.

Consequently it is possible to form the insulating resin only on the bias electrode, and hence the internal stress conventionally generated in the border between a part of the active matrix substrate, in which part the semiconductor film is formed, and a part of the active matrix substrate, in which part the semiconductor film is not formed, is not generated, since the thickness of the insulating resin in the both side of the border is uniform.

Therefore this makes it possible to acquire the flat panel image sensor having excellent strength.

Moreover, the flat panel image sensor of the present invention arranged as above may include:
- an active matrix substrate;
- a semiconductor film formed on the active matrix substrate;
- a bias electrode formed on the semiconductor film;
- a first spacer formed on the active matrix substrate so as to surround the semiconductor film;
- an insulating resin formed on surfaces of the semiconductor film, the bias electrode, and the active matrix substrate, and sealed by the first spacer; and
- a protective substrate facing the active matrix substrate via the first spacer and covering the insulating film, wherein a second spacer is formed on a whole part of the active matrix substrate, in which part neither the semiconductor film nor the first spacer is formed. A thickness of the second spacer is preferably 50% to 150% of a thickness of the semiconductor film.

According to the arrangement above, modifying the thickness of the second spacer reduces the difference in the thicknesses of the insulating resin, in the area in which the semiconductor film is formed and in the area in which the same is not formed, sufficiently to prevent generation of the internal stress in the insulating resin causing the warpage of the active matrix substrate and the degradation of the strength thereof.

Therefore the stress in the insulating resin can be reduced and hence the warpage of the active matrix substrate is prevented in advance, and the impact strength of the flat panel image sensor is improved. As a result, it is possible to provide the flat panel image sensor having excellent strength.

Moreover, the flat panel image sensor of the present invention arranged as above may include:
- an active matrix substrate;
- a semiconductor film formed on the active matrix substrate;
- a bias electrode formed on the semiconductor film;
- a first spacer formed on the active matrix substrate so as to surround the semiconductor film;
- an insulating resin formed on surfaces of the semiconductor film, the bias electrode, and the active matrix substrate, and sealed by the first spacer; and
- a protective substrate facing the active matrix substrate via the first spacer and also covering the insulating film, wherein a pit part is formed in a whole part of the protective substrate, in which part the protective substrate faces the semiconductor film. A depth of the pit part is preferably 50% to 150% of a thickness of the semiconductor film.

According to the arrangement above, modifying the depth of the pit part reduces the difference in the thicknesses of the insulating resin, in the area in which the semiconductor film is formed and in the area in which the semiconductor film is not formed, sufficiently to prevent generation of the internal stress in the insulating resin causing the warpage of the active matrix substrate and the degradation of the strength thereof.

Therefore the stress in the insulating resin can be reduced and hence the warpage of the active matrix substrate is prevented in advance, and the impact strength of the flat panel image sensor is improved. Therefore this makes it possible to acquire the flat panel image sensor having excellent strength.

Moreover, the flat panel image sensor of the present invention arranged as above may include:

an active matrix substrate;

a semiconductor film formed on the active matrix substrate;

a first spacer formed on the active matrix substrate so as to surround the semiconductor film; and an insulating resin formed on surfaces of the semiconductor film and the active matrix substrate, and sealed by the first spacer, wherein the insulating resin formed on the semiconductor film is as thick as the insulating resin formed on a peripheral part of the active matrix substrate, in which area neither the semiconductor film nor the first spacer is formed.

Moreover, the flat panel image sensor of the present invention arranged as above may include:

an active matrix substrate;

a semiconductor film formed on the active matrix substrate;

a spacer formed on the active matrix substrate so as to surround the semiconductor film; and an insulating resin formed on a surface of the semiconductor film, and sealed by the spacer, wherein the spacer covers a whole part of the active matrix substrate, in which part the semiconductor film is not formed, and also is formed to be thicker than the semiconductor film.

Moreover, the flat panel image sensor of the present invention arranged as above may include:

an active matrix substrate;

a semiconductor film formed on the active matrix substrate; and a first spacer formed on the active matrix substrate so as to surround the semiconductor film without touching the film;

wherein a second spacer is formed on a whole part of the active matrix substrate, in which part neither the semiconductor film nor the first spacer is formed.

Moreover, the flat panel image sensor of the present invention arranged as above may include:

an active matrix substrate;

a semiconductor film formed on the active matrix substrate; and a protective substrate provided to face the active matrix substrate, wherein a pit part is formed in a whole part of the protective substrate, in which part the protective substrate faces the semiconductor film.

Moreover, the flat panel image sensor of the present invention arranged as above may include:

an active matrix substrate;

a semiconductor film formed on the active matrix substrate;

a bias electrode formed on the semiconductor film;

a spacer formed on the active matrix substrate so as to surround the semiconductor film;

an insulating resin formed on a surface of the semiconductor film, and sealed by the spacer; and a protective substrate facing the active matrix substrate via the spacer and covering the insulating film, wherein a step for changing the thickness of the insulating resin is formed in an area of the protective substrate, in which part the protective coat does not face the semiconductor film.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A flat panel image sensor, comprising:

an active matrix substrate;

a semiconductor film formed on the active matrix substrate;

a bias electrode formed on the semiconductor film;

a first spacer formed on the active matrix substrate so as to surround the semiconductor film;

an insulating resin formed on surfaces of the semiconductor film, the bias electrode, and the active matrix substrate, and sealed by the first spacer; and a protective substrate facing the active matrix substrate via the first spacer and covering the insulating film, wherein the insulating resin formed on the semiconductor film is as thick as the insulating resin formed on a peripheral part of the active matrix substrate, in which part neither the semiconductor film nor the first spacer is formed.

2. The flat panel image sensor as set forth in claim 1, wherein the first spacer is formed to surround the semiconductor film without touching the film.

3. The flat panel image sensor as set forth in claim 1, comprising a second spacer, which is as thick as the semiconductor film and formed on a whole part of the active matrix substrate, in which part neither the semiconductor film nor the first spacer is formed, wherein the insulating resin is formed on the second spacer and the semiconductor film.

4. The flat panel image sensor as set forth in claim 1, further comprising a second spacer, which is as thick as a sum of a thickness of the semiconductor film and that of the bias electrode formed on a whole part of the active matrix substrate, in which part neither the semiconductor film nor the first spacer is formed, wherein the insulating resin is formed on the second spacer and the semiconductor film.

5. The flat panel image sensor as set forth in claim 1, wherein a pit part, whose depth is equal to a thickness of the semiconductor film, is formed on a whole part of the protective substrate, in which part the protective substrate faces the semiconductor film.

6. The flat panel image sensor as set forth in claim 1, wherein a pit part, whose depth is equal to a sum of a thickness of the semiconductor film and that of the bias electrode, is formed on a whole part of the protective substrate, in which part the protective substrate faces the semiconductor film.

7. A flat panel image sensor, comprising:

an active matrix substrate;

a semiconductor film formed on the active matrix substrate;

a bias electrode formed on the semiconductor film;

a spacer formed on the active matrix substrate so as to surround the semiconductor film;

an insulating resin formed on the semiconductor film and sealed by the spacer; and a protective substrate facing the active matrix substrate via the spacer and covering the insulating film, wherein the spacer is formed to cover a whole part of the active matrix substrate, in which part the semiconductor film is not formed, and also is formed to be thicker than the semiconductor film.

8. The flat panel image sensor as set forth in claim 7, wherein the spacer is formed to be thicker than a sum of a thickness of the semiconductor film and that of the bias electrode.

9. A flat panel image sensor, comprising:

an active matrix substrate;

a semiconductor film formed on the active matrix substrate;

a bias electrode formed on the semiconductor film;

a first spacer formed on the active matrix substrate so as to surround the semiconductor film without touching the film;

an insulating resin formed on surfaces of the semiconductor film, the bias electrode, and the active matrix substrate, and sealed by the first spacer; and a protective substrate facing the active matrix substrate via the first spacer and covering the insulating film, wherein a second spacer is formed on a whole part of the active matrix substrate, in which part neither the semiconductor film nor the first spacer is formed.

10. The flat panel image sensor as set forth in claim 9, wherein a thickness of the second spacer is 50% to 150% of a thickness of the semiconductor film.

11. A flat panel image sensor, comprising:

an active matrix substrate;

a semiconductor film formed on the active matrix substrate;

a bias electrode formed on the semiconductor film;

a first spacer formed on the active matrix substrate so as to surround the semiconductor film without touching the film;

an insulating resin formed on surfaces of the semiconductor film, the bias electrode, and the active matrix substrate, and sealed by the first spacer; and a protective substrate facing the active matrix substrate via the first spacer and also covering the insulating film, wherein a pit part is formed in a whole part of the protective substrate, in which part the protective substrate faces the semiconductor film.

12. The flat panel image sensor as set forth in claim 11, wherein a depth of the pit part is 50% to 150% of a thickness of the semiconductor film.

13. A flat panel image sensor, comprising:

an active matrix substrate;

a semiconductor film formed on the active matrix substrate;

a first spacer formed on the active matrix substrate so as to surround the semiconductor film; and an insulating resin formed on surfaces of the semiconductor film and the active matrix substrate, and sealed by the first spacer, wherein the insulating resin formed on the semiconductor film is as thick as the insulating resin formed on a peripheral part of the active matrix substrate, in which area neither the semiconductor film nor the first spacer is formed.

14. A flat panel image sensor, comprising:

an active matrix substrate;

a semiconductor film formed on the active matrix substrate;

a spacer formed on the active matrix substrate so as to surround the semiconductor film; and an insulating resin formed on a surface of the semiconductor film, and sealed by the spacer, wherein the spacer covers a whole part of the active matrix substrate, in which part the semiconductor film is not formed, and also is formed to be thicker than the semiconductor film.

15. A flat panel image sensor, comprising:

an active matrix substrate;

a semiconductor film formed on the active matrix substrate; and a first spacer formed on the active matrix substrate so as to surround the semiconductor film without touching the film;

wherein a second spacer is formed on a whole part of the active matrix substrate, in which part neither the semiconductor film nor the first spacer is formed.

16. A flat panel image sensor, comprising:

an active matrix substrate;

a semiconductor film formed on the active matrix substrate; and a protective substrate provided to face the active matrix substrate, wherein a pit part is formed in a whole part of the protective substrate, in which part the protective substrate faces the semiconductor film.

* * * * *